United States Patent
Liang et al.

(10) Patent No.: US 9,871,177 B2
(45) Date of Patent: Jan. 16, 2018

(54) ANISOTROPIC CONDUCTIVE FILM (ACF) INCLUDING A RELFECTIVE LAYER

(71) Applicant: Trillion Science, Inc., Fremont, CA (US)

(72) Inventors: Rong-Chang Liang, Cupertino, CA (US); Jane Sun, San Jose, CA (US); Keren Zhang, Fremont, CA (US)

(73) Assignee: TRILLION SCIENCE, INC., Fremont, CA (US)

( * ) Notice: Subject to any disclaimer, the term of this patent is extended or adjusted under 35 U.S.C. 154(b) by 126 days.

(21) Appl. No.: 14/638,306

(22) Filed: Mar. 4, 2015

(65) Prior Publication Data

US 2016/0260875 A1  Sep. 8, 2016

(51) Int. Cl.
 *H01L 33/60* (2010.01)
 *G02F 1/29* (2006.01)
 *H05B 33/06* (2006.01)
 *H05B 33/22* (2006.01)

(52) U.S. Cl.
CPC ............... *H01L 33/60* (2013.01); *G02F 1/29* (2013.01); *H05B 33/06* (2013.01); *H05B 33/22* (2013.01)

(58) Field of Classification Search
CPC .......... H01L 33/60; G02F 1/29; H05B 33/06; H05B 33/22; H05K 2201/10106; H05K 2201/2054; H05K 3/323; Y10T 428/25; Y10T 428/28; C09J 7/00; C09J 11/04; C09J 2201/36; B32B 2307/706
USPC ................. 428/40.1, 41.8, 343, 354
See application file for complete search history.

(56) References Cited

U.S. PATENT DOCUMENTS

| | | | |
|---|---|---|---|
| 8,802,214 B2 | 8/2014 | Liang et al. | |
| 8,852,462 B2 | 10/2014 | Umakoshi et al. | |
| 2011/0266578 A1 | 11/2011 | Kanisawa et al. | |
| 2012/0295098 A1 | 11/2012 | Hwang et al. | |
| 2013/0071636 A1 | 3/2013 | Lee et al. | |
| 2013/0092310 A1* | 4/2013 | Ishigami | H01L 24/29 156/60 |
| 2014/0141195 A1 | 5/2014 | Liang et al. | |
| 2014/0175481 A1 | 6/2014 | Tischler | |
| 2014/0261992 A1 | 9/2014 | Liang et al. | |
| 2014/0312501 A1 | 10/2014 | Liang et al. | |
| 2014/0368763 A1 | 12/2014 | Watanabe | |

OTHER PUBLICATIONS

Liang, R.C. et al., "Fixed-Array Anisotropic Conductive Film (FACF) for Ultra Fine Pitch Applications," International Conference on Flexible and Printed Electronics (ICFPE) Proceedings, Paper S1-2-4, Hsinchu, Taiwan (2010).

Liang, R.C. et al., "Ultra Fine Pitch Anisotropic Conductive Film with Fixed Array of Conductive Particles," IDW'10 Proceeding, p. 1909, Paper FMC4-4, Fukuoka, Japan (2010).

(Continued)

*Primary Examiner* — Catherine A Simone
(74) *Attorney, Agent, or Firm* — Thompson Hine LLP

(57) ABSTRACT

An anisotropic conductive film (ACF) is disclosed. In one approach, the ACF includes a non-reflective adhesive layer including a top surface, a plurality of conductive particles included with the non-reflective adhesive layer, and a reflective adhesive layer disposed along the top surface of the non-reflective adhesive layer. The reflective layer includes at least five percent reflective particles by percentage weight.

27 Claims, 2 Drawing Sheets

(56) References Cited

OTHER PUBLICATIONS

"Ultra-Fine Pitch Fixed Array ACF," Tech on Chinese (Mar. 1, 2011).
Asai, S. et al., "Development of an Anisotropic Conductive Adhesive Film (ACAF) from Epoxy Resins," Journal of Applied Polymer Science, vol. 56, pp. 769-777 (1995).
PCT, International Search Report and Written Opinion; Patent Application No. PCT/US2016/020190 (dated May 11, 2016).

* cited by examiner

ANISOTROPIC CONDUCTIVE FILM (ACF) INCLUDING A RELFECTIVE LAYER

FIELD

This disclosure relates generally to an anisotropic conductive film (ACF). More particularly, this disclosure relates an ACF including a non-reflective adhesive layer and a reflective layer. The reflective layer may be an adhesive layer including a reflective additive, or a thin film deposited reflective layer. The reflective layer of the ACF results in improved light output and color purity characteristics when the ACF is part of a light-emitting or a light-transmitting device. Additionally, the reflective layer of the ACF may also improve attachment of the ACF to an electrode substrate.

BACKGROUND

Anisotropic conductive films (ACFs) are commonly used in flat panel display driver integrated circuit (IC) bonding. A typical ACF bonding process includes a first step in which the ACF is attached onto the electrodes of the panel glass, a second step in which the driver IC bonding pads are aligned with the panel electrodes, and a third step in which pressure and heat are applied to the bonding pads to melt and cure the ACF within seconds. The conductive particles of the ACF provide anisotropic electrical conductivity between the panel electrodes and the driver IC.

The need for ultra-fine pitch ACFs increases dramatically as the use of high definition displays in electronic devices such as smart phones and electronic tablets become the market trend. However, as the pitch size decreases, the size of the electrodes must also become smaller and a higher concentration of conductive particles is needed to provide the required particle density on the connected electrodes to assure satisfactory electrical conductivity or impedance.

The conductive particles of a traditional ACF are typically randomly dispersed in the ACF. There is a limitation on the particle density of such a dispersion system due to X-Y conductivity. In many bonding processes using traditional ACFs, only a small fraction of conductive particles are captured on electrodes. Most of the particles are actually flushed out to the spacing area between electrodes and in some case result in undesirable shorts in the X-Y plane of the ACF. In a fine pitch bonding application, the conductive particles density should be high enough to have an adequate number of conductive particles bonded on each bonding pad. However, the probability of a short circuit or undesirable high-conductivity in the insulating area between two bonding pads also increases due to the high density of conductive particles and the characteristics of random dispersion.

Fixed-array ACFs overcome some of the shortcomings of traditional ACFs. The conductive particles of a fixed-array ACF are arranged in pre-determined array pattern. Fixed-array ACFs have been recognized as one of the most effective approaches for achieving high resolution connection of ultra-fine pitch ICs. For example, a minimum bonding area as small as about 300 to 400 $\mu m^2$ and a minimum bonding space as narrow as 3 $\mu m$ have been demonstrated with fixed-array ACFs having a conductive particle density of at least 30,000 pcs/$mm^2$. Some references which discuss fixed-array ACFs include, for example, Liang, R. C. et al., "Fixed-Array Anisotropic Conductive Film (FACF) for Ultra Fine Pitch Applications," International Conference on Flexible and Printed Electronics (ICFPE) Proceedings, Paper S1-2-4, Hsinchu, Taiwan (2010); "Ultra Fine Pitch Anisotropic Conductive Film with Fixed Array of Conductive Particles," IDW'10 Proceeding, p. 1909, Paper FMC4-4, Fukuoka, Japan (2010); "Ultra-Fine Pitch Fixed Array ACF," Tech on Chinese (Mar. 1, 2011.); and U.S. Publication No. 2014/0141195 to Liang et al.

Fixed-array ACFs also have some drawbacks. In particular, attachment of the fixed-array ACF to the electrode substrate is not reproducible if the density of conductive particles of the fixed-array ACF is too high. A conductive particle density of, for example, 20,000 pcs/$mm^2$ or more may impede the attachment of the fixed-array ACF to the electrode substrate because the surface of the fixed-array ACF is predominately covered by an array of non-tacky conductive particles. Moreover, due to the high concentration of conductive particles such as gold (Au), nickel (Ni) (i.e., >30,000 pcs/$mm^2$) or other metalized polymer particles, the coloring of the fixed-array ACF may be relatively dark or brownish in color, and hazy. If the ACF is used in conjunction with light-emitting device such as a light emitting diode (LED) or an organic LED (OLED), then the dark color of the fixed-array ACF may negatively impact the light intensity and color purity emitted and/or reflected from the light-emitting device. Similar issues also exist if the fixed-array ACF is used in a light-transmitting or reflecting device such as a liquid-crystal display (LCD) display.

In one attempt to alleviate the deterioration in light intensity and color purity of the device a reflective pigment, such as titanium dioxide ($TiO_2$), was added to the existing adhesive layer of the light-emitting device. However, adding reflective pigment to the existing adhesive layer does not improve reflectivity, light output, or color purity of the device unless the concentration of reflective pigment is higher than a certain threshold value (typically ≥10%). However, such a high concentration of the reflective pigment in the adhesive may tend to result in a significant degradation in particle transfer efficiency and uniformity in the microfluidic particle transfer process. In contrast, light scattering within a thick adhesive layer containing a low concentration of reflective pigment will result in an improvement in the opacity as well as a decrease in the percentage of reflectance. Adhesive layers currently available generally include a relatively low percentage (i.e., less than two percent) of reflective pigment as a filler. Accordingly, there exists need in the art for an improved fixed-array ACF having a high concentration of conductive particles that results in improved reflectivity, light output, and color purity characteristics when used in light-emitting and light-transmitting or reflective devices.

SUMMARY

In one aspect, an anisotropic conductive film (ACF) is disclosed, and includes a non-reflective adhesive layer including a top surface, a plurality of conductive particles included with the non-reflective adhesive layer, and a reflective adhesive layer disposed along the top surface of the non-reflective adhesive layer. The reflective layer includes at least five percent reflective particles by percentage weight.

In another aspect, an ACF is disclosed, and includes a non-reflective adhesive layer including a top surface, a plurality of conductive particles included with the non-reflective adhesive layer, and a thin film deposited reflective layer disposed along the top surface of the non-reflective adhesive layer. The thin film deposited reflective layer includes a second top surface. The ACF also includes a secondary adhesive layer disposed along the second top surface of the thin film deposited reflective layer.

In yet another aspect, a light-emitting device is disclosed, and includes a light-emitting housing including a plurality of light-emitting elements, an electrode substrate, a plurality of chip bumps disposed between the light-emitting housing and the electrode substrate, and an ACF electrically connecting the light-emitting housing and the electrode substrate. The ACF includes a non-reflective adhesive layer including a top surface, a plurality of conductive particles included with the non-reflective adhesive layer, and a reflective adhesive layer disposed along the top surface of the non-reflective adhesive layer. The reflective layer includes at least five percent reflective particles by percentage weight.

In still another embodiment, light-reflecting device is disclosed and includes a housing, an electrode substrate, a plurality of chip bumps disposed between the light-reflecting element and the electrode substrate, and an ACF electrically connecting the housing and the electrode substrate. The ACF includes a non-reflective adhesive layer including a top surface, a plurality of conductive particles included with the non-reflective adhesive layer, and a reflective adhesive layer disposed along the top surface of the non-reflective adhesive layer. The reflective layer includes at least five percent reflective particles by percentage weight.

Other objects and advantages of the disclosed method and system will be apparent from the following description, the accompanying drawings and the appended claims.

DETAILED DESCRIPTION

Figure 1:
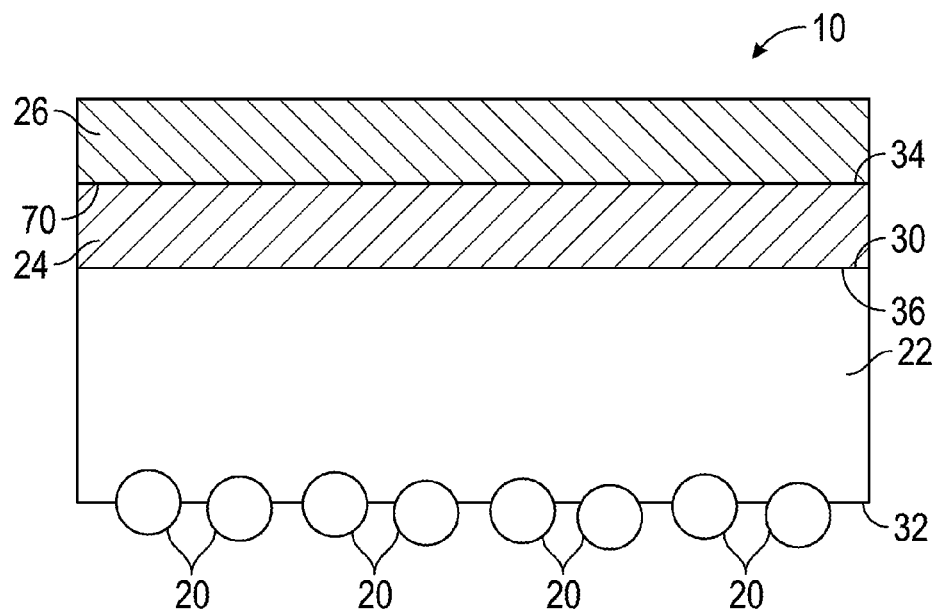
FIG. 1 is a side cross-sectional view of the disclosed ACF including a reflective adhesive layer.

FIG. 1 is a schematic side cross-sectional view of the disclosed anisotropic conductive film (ACF) 10. The ACF 10 includes a plurality of conductive particles 20, a first, non-reflective adhesive layer 22, a second, reflective adhesive layer 24, and a release liner 26. Those of ordinary skill in the art will readily appreciate that the non-reflective adhesive layer 22, the reflective adhesive layer 24, and the release liner 26 are not drawn to scale in the figures, and the release liner 26 may actually be thicker than the non-reflective adhesive layer 22 and the reflective adhesive layer 24. The non-reflective adhesive layer 22 includes a first, top surface 30 as well as a second, bottom surface 32. The reflective adhesive layer 24 also includes a first, top surface 34 as well as a second, bottom surface 36. As explained in greater detail below and shown in FIG. 2, in an alternative embodiment an ACF 100 may include a thin film deposited reflective instead of the reflective adhesive layer 24. The ACF 100 also includes a separate, additional layer of adhesive 128.

Turning back to FIG. 1, the release liner 26 may be provided along the top surface 34 of the reflective adhesive layer 24, and is used to carry the ACF 10. The reflective adhesive layer 24 is disposed along the top surface 30 of the non-reflective adhesive layer 22, and the conductive particles 20 may be disposed along the bottom surface 32 of the non-reflective adhesive layer 22. Any of the conductive particles 20 for use in ACFs may be used in practicing this disclosure. Some examples of conductive particles 20 that may be used for the ACF 10 are disclosed in commonly owned U.S. Pat. No. 8,802,214 to Liang et al., which is incorporated herein in its entirety by reference. In an embodiment, non-reflective adhesive layer 22 includes a concentration of at least 20,000 pcs/mm$^2$ of conductive particles 20, and in one specific embodiment at least 30,000 pcs/mm$^2$.

In one exemplary embodiment, the ACF 10 is a non-random or fixed-array ACF. That is, the conductive particles 20 are arranged in predetermined locations along the bottom surface 32 of the non-reflective adhesive layer 22. The '214 patent to Liang discloses a process for manufacture of a fixed-array ACF. However, although a fixed-array ACF is described, it is to be understood that the present disclosure is not limited to only a fixed-array ACF. Instead, the disclosure may also apply to traditional ACFs as well, where the conductive particles 20 are randomly dispersed within the non-reflective adhesive layer 22.

In the embodiment as shown in FIG. 1, the conductive particles 20 are partially embedded within the non-reflective adhesive layer 22, however it is to be understood that in another embodiment, the conductive particles 20 may be completely embedded within the non-reflective adhesive layer 22 as well. The conductive particles 20 may be transferred from a filled microcavity array onto the non-reflective adhesive layer 22 to create the ACF 10, and is disclosed in the '214 patent to Liang.

The non-reflective adhesive layer 22 may be thermoplastic, thermoset, or their precursors. Useful adhesives include, but are not limited to, pressure sensitive adhesives, hot melt adhesives, heat or radiation curable adhesives. The adhesives may comprise, for example, epoxide, phenolic resin, amine-formaldehyde resin, polybenzoxazine, polyurethane, cyanate esters, acrylics, acrylates, methacrylates, vinyl polymers, rubbers such as poly(styrene-co-butadiene) and their block copolymers, polyolefins, polyesters, unsaturated polyesters, vinyl esters, epoxy resins, phenoxy resins, acrylic resins, polycaprolactone, polyethers, and polyamides. Epoxide, cyanate esters and multifunctional acrylates are particularly useful. Catalysts or curing agents including latent curing agents may be used to control the curing kinetics of the adhesive. Useful curing agents for epoxy resins include, but are not limited to, dicyanodiamide (DICY), adipic dihydrazide, 2-methylimidazole and its encapsulated products such as Novacure HX dispersions in liquid bisphenol A epoxy from Asahi Chemical Industry, amines such as ethylene diamine, diethylene triamine, triethylene tetraamine, BF3 amine adduct, Amicure from Ajinomoto Co. Inc., sulfonium salts such as diaminodiphenylsulphone, p-hydroxyphenyl benzyl methyl sulphonium hexafluoroantimonate. Coupling agents including, but are not limited to, titanate, zirconate and silane coupling agents such as glycidoxypropyl trimethoxysilane and 3-aminopropyl trimethoxy-silane may also be used to improve the durability of the ACF. The effect of curing agents and coupling agents on the performance of epoxy-based ACFs can be found in S. Asai, et al., *J. Appl. Polym. Sci.*, 56, 769 (1995). The entire paper is hereby incorporated by reference in its entirety.

In one embodiment, the non-reflective adhesive layer 22 may include a thickness ranging from about 4 μm to about 25 μm. In one specific embodiment, the thickness of the non-reflective adhesive layer 22 may range from about 2 μm to about 15 μm, and specifically from about 3 μm to about 8 μm. In one embodiment, the reflective adhesive layer 24 may include a thickness ranging from about 1 μm to about 10 μm, and specifically from about 2 μm to about 6 μm. In one specific embodiment, the thickness of the reflective adhesive layer 24 may range from about 3 μm to about 5 μm.

Is it to be understood that the reflective adhesive layer 24 includes reflective particles that improve the reflectivity of the ACF 10. In addition to improved reflectivity, the reflective particles may also improve attachment of the ACF 10 to an electrode substrate 76 (shown in FIG. 3) during prebonding. Not to be bound by theory, it is believed that the reflective particles in the reflective adhesive layer 24 may either function as a local defect to provide crack initiation and propagation required to fracture the reflective adhesive layer 24 at the border of a bonding and a non-bonding area, or alternatively, reduces of the adhesion the ACF 10 to the release liner 26.

In one embodiment, the reflective particles of the reflective adhesive layer 24 may be a white pigment such as titanium dioxide ($TiO_2$). However, it is to be understood that the reflective particles are not limited to titanium dioxide. For example, the reflective particles may be other types of white pigments such as, but not limited to, zinc oxide (ZnO) and zirconium oxide ($ZrO_2$). In one embodiment, the reflective particles may be a holo polymer particles, such as plastic pigments. In particular, the reflective particles may be holo cross-linked polymer particles produced by Rohm and Haas (now the Dow Chemical Company of Midland, Mich.). In still another embodiment, the reflective particles may be reflective or retro-reflective particles that are either electrical insulators or electrical conductors encapsulated with an electrical insulator. Some examples of reflective or retro-reflective particles are hollow glass microspheres, mica, cholesteric liquid crystal pigment particles, and high refractive index oxides. Some examples of high refractive index oxides include, but are not limited to, indium-tin-oxide (ITO), zinc oxide (ZnO), titanium dioxide ($TiO_2$), indium-zinc-oxide (IZO), tin oxide (SnO), zirconium oxide ($ZrO_2$) and their alloys thereof. In one embodiment, low index colorless fillers such as boron nitride (SN), aluminium oxide ($Al_2O_3$), silicon oxide ($SiO_2$), calcium carbonate ($CaCO_3$), or calcium sulfate ($CaSO_4$), or combinations thereof may be used to improve the reflectance of the pigmented adhesive layer.

The shape of the reflective particles may be, for example, substantially spherical, scale-like, amorphous, or needle-like. If the reflective particles have a substantially spherical shape, it is to be understood that if a diameter of the reflective particle is too small, then light reflectance may suffer. However, if the diameter is too large, then anisotropic connection due to the conductive particles tends to be inhibited. Thus, in one embodiment, the average diameter of the reflective particles may range from about 0.1 μm to about 5 μm. In a specific embodiment, the diameter of the reflective particles may range from about 0.2 μm to about 1 μm. If the reflective particle includes a scale-like shape, the longer diameter thereof may range from about 0.1 μm to about 10 μm, and in one specific embodiment from about 0.2 μm to about 1 μm, and the thickness thereof may range from about 1 μm to about 10 μm, and in one specific embodiment from about 2 μm to about 5 μm. If the reflective particle is covered with an insulating coating, the size of the reflective particle is a size including the insulating coating.

It is to be understood that if the percentage of reflective particles within the reflective adhesive layer 24 is too high, this may result in reduced adhesion to the electrode substrate 76 or the chip bump 80 (shown in FIG. 3) during pre-bonding. Too high of a percentage of reflective particles may also result in reduced impact resistance, thermal shock resistance, and humidity resistance. Likewise, if the percentage of reflective particles within the adhesive layer 24 is too low, then then light reflectance may suffer. The reflective adhesive layer 24 provides a reflectivity of at least 20%. In one embodiment, the reflective adhesive layer 24 provides reflectivity of at least 30%, and in one specific embodiment the reflective adhesive layer 24 provides reflectivity of at least 50%. The reflective adhesive layer 24 may include at least five percent (≥5%) reflective particles by percentage weight, and in one specific embodiment at least ten percent (≥10%) reflective particles by percentage weight. In one embodiment, the percentage of reflective particles within the reflective adhesive layer 24 may range from about 10% to about 20% by weight, which results in a light reflectance of at least 50%. It should be appreciated that a higher percentage of reflective particles may be used within the reflective adhesive layer 24 as well, however this may result in reduced adhesion or reliability of the resultant device. Specifically, the maximum percentage of reflective particles within the reflective adhesive layer 24 is about 30% by weight.

In one embodiment, a bottom surface 70 of the release liner 26 may first be micro-embossed, and the reflective adhesive layer 24 may be coated upon the release liner 26. Alternatively, in another embodiment, the top surface 30 of the non-reflective adhesive layer 22 may be micro-embossed instead, and the reflective adhesive layer 24 may be coated upon the top surface 30 of the non-reflective adhesive layer 22. In other words, either the release liner 26 or the non-reflective adhesive layer 22 may include a pre-embossed surface, and the reflective adhesive layer 24 may be coated upon the respective pre-embossed surface.

Figure 2:
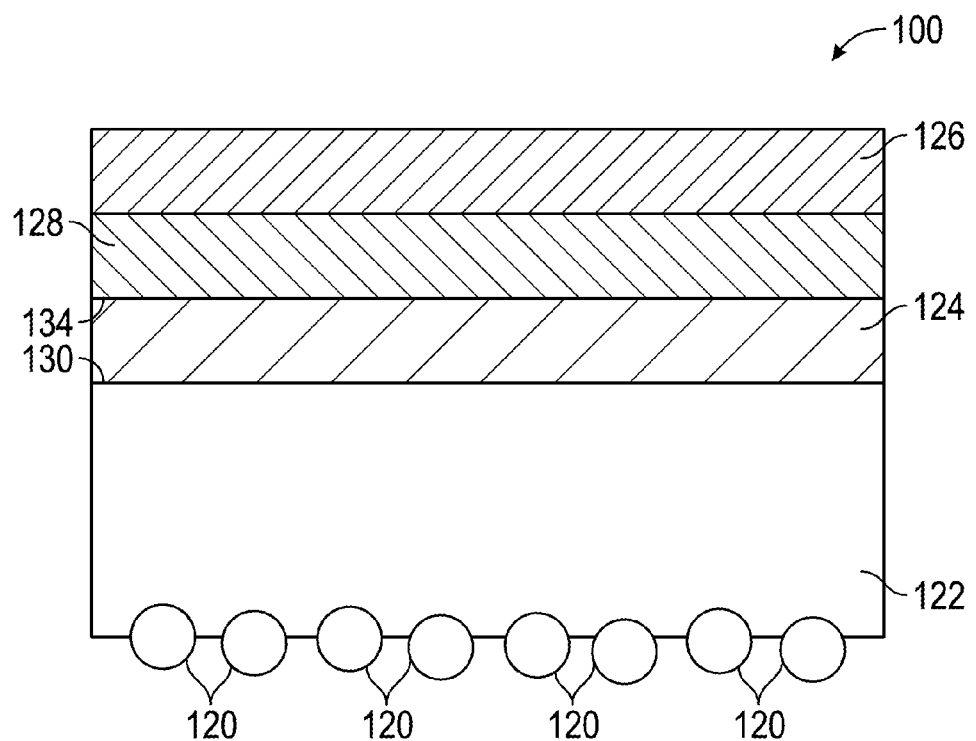
FIG. 2 is an alternative embodiment of the ACF shown in FIG. 1, where the ACF includes a thin film deposited reflective layer instead of the reflective adhesive layer.

FIG. 2 is alternative embodiment of an ACF 100, where the reflective layer 124 is deposited or coated a top surface 130 of a non-reflective adhesive layer 122 by thin film deposition such as, for example, electroless or electroplating, vapor deposition or sputtering. In other words, the non-reflective adhesive layer 122 may be either a electro or electroless plated layer, vapor deposited layer or a reflective sputtered layer. Neutral color metal or metal oxide layers such as silver (Ag), aluminium (Al), titanium dioxide ($TiO_2$), tin oxide (SnO), zinc oxide (ZnO), and their alloys having a thickness ranging from about 5 to about 300 nm thick, and in one specific embodiment about 10 to 100 nm thick may be used.

In the embodiment as shown in FIG. 2, the reflective layer 124 is a thin film deposited reflective layer that does not include an adhesive. Accordingly, the secondary or additional adhesive layer 128 may be disposed along a top surface 134 of the reflective layer 124 in order to make tacky contact with a viewing layer (shown in FIG. 2) once a release liner 126 is removed. Specifically, the adhesive layer 128 makes tacky contact with the viewing layer upon assembly of an electronic product, such as an LED, which is described in greater detail below. The composition of the adhesive layer 128 may be the same as or different from either the non-reflective adhesive layer 122 or the reflective adhesive layer 124. The reflective layer 124 may be laminated or deposited onto the non-reflective adhesive layer 122. Alternatively, the reflective layer 124 may be first deposited onto the additional layer of adhesive 128, which is precoated on the release liner 126, and the resultant thin film deposited adhesive is then laminated onto the non-reflective adhesive layer 122. The conductive particles 120 may then be filled into and transferred from a microcavity array (not shown) to the non-reflective adhesive layer 122.

Continuing to refer to FIG. 2, in the event a vapor deposition technique is used, the ACF 100 is manufactured by a process where the reflective layer 124 is first deposited or coated on the top surface 130 of the non-reflective adhesive layer 122 by vapor deposition or sputtering, and the additional adhesive layer (not illustrated) may be disposed along a top surface of the reflective layer in order to make tacky contact with a viewing layer. Conductive particles 120 may then be filled into a microcavity array by a microfluidic filling process and subsequently transferred onto the non-reflective layer 122 using a particle transfer process disclosed in the '214 patent to Liang. Alternatively, turning back to FIG. 1, in an embodiment where the reflective pigment is a particle, the ACF 10 may be manufactured by first coating the reflective adhesive layer 24 onto either the bottom surface 70 of the release liner 26 or the top surface 30 of the non-reflective adhesive layer 22. Then the conductive particles 20 may then be filled into a microcavity array by a microfluidic filling process and subsequently transferred onto the non-reflective layer 22 using a particle transfer process as disclosed in the '214 patent to Liang.

Figure 3:
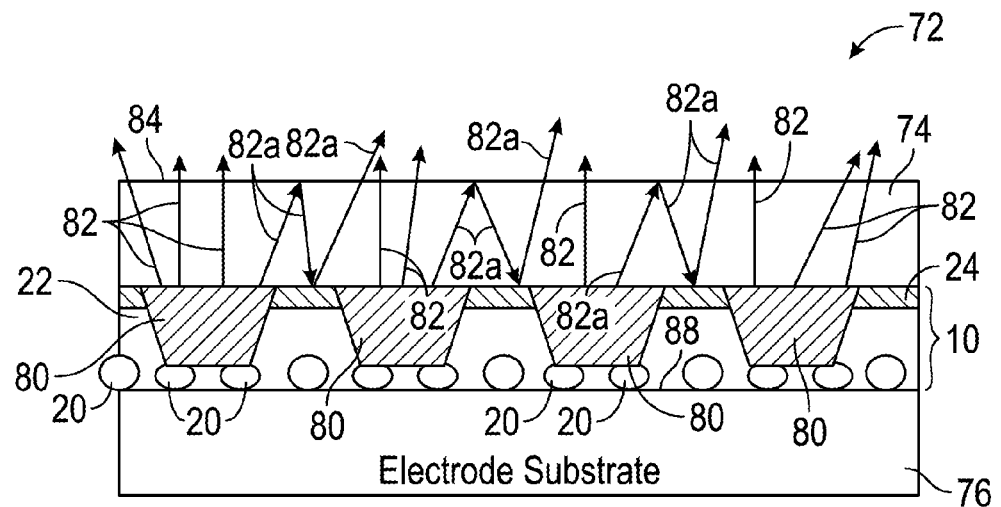
FIG. 3 is an embodiment of a light-emitting device including the disclosed ACF shown in FIG. 1.

FIG. 3 is an exemplary illustration of a light-emitting device 72. The ACF 10 may be used to electrically connect a light-emitting housing 74 of the light-emitting device 72 to the electrode substrate 76 of the light-emitting device 72. The light-emitting housing 74 may contain or include a plurality of light-emitting elements such as, for example, LEDs or organic LEDs (OLEDs), traces or electrodes, substrate, and optical and packaging subsystems (not illustrated). The light-emitting device 72 may include a plurality of chip bumps 80 disposed between the light-emitting element 74 and the electrode substrate 76 of the light-emitting device 72. As seen in FIG. 3, the conductive particles 20 may be deformable, and a squeezed into a generally elliptic shape by the chip bumps 80 during the bonding process in order to establish an improved vertical electrical connection. In the embodiment as shown in FIG. 3, the light-emitting elements of the light-emitting housing 74 such as, for example, the LEDs or OLEDs are built on top of the chip bumps 80 (the LEDs are not visible in FIG. 3).

Light rays 82 emitted from the light emitting elements of the light-emitting housing 74 may pass through the light-emitting device 72 to reach an observer (not illustrated). As seen in FIG. 3, a portion of the light rays 82a may deflect along an upper surface 84 of the light-emitting housing 74 and are directed back towards the light-emitting chip bumps 80. The light rays 82a may then be reflected by the reflective adhesive layer 24 of the ACF 10 in a direction back towards the upper surface 84 of the light-emitting housing 74. In other words, the reflective adhesive layer 24 of the ACF 10 is used to re-reflect light and also improve total light output.

Referring to both FIGS. 1 and 3, the light-emitting device 72 may be manufactured using a typical ACF/bonding process, where the ACF 10 is first placed on a top surface 88 of the electrode substrate 76, where the conductive particles 20 are facing down, against the top surface 88 of the electrode substrate 76. Pressure may then be applied to the ACF 10 and the electrode substrate 76 by a roller or stamp. In one embodiment, pressure is applied for about 1 second to about 3 seconds between about 70° C. to 80° C. at about 0.2 to about 0.3 MPa. The release liner 26 (shown in FIG. 1) may then be removed. The chip bumps 80 may then be placed on top of the ACF 10. High pressure exerted by a chip-on-glass (COG) bonder at about 60 MPa for about 5 seconds, with heat ranging from about 150° C. to about 180° C. may then be applied for about 5 to 10 seconds to complete the bonding between the ACF 10, the electrode substrate 76, and the chip bumps 80.

Figure 4:
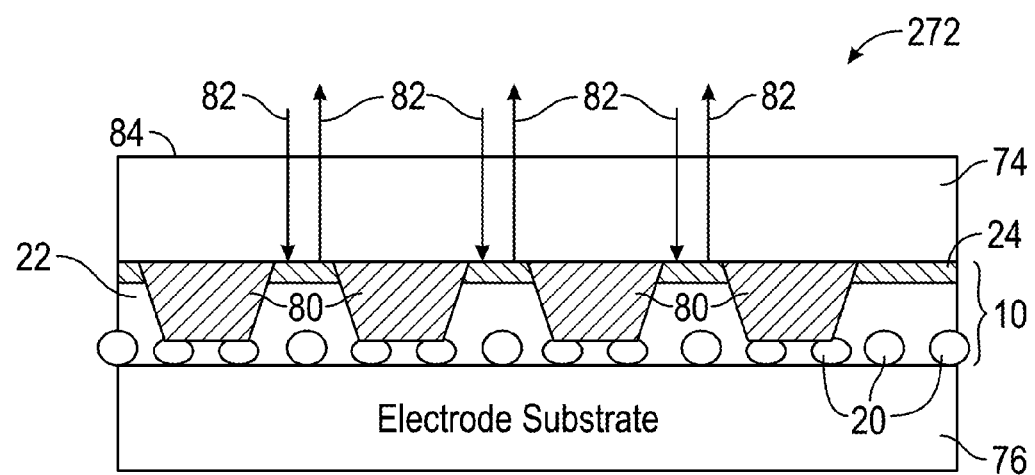
FIG. 4 is an embodiment of a light-transmitting device including the disclosed ACF shown in FIG. 1.

FIG. 4 is an illustration of a light-reflecting or transflecting device 272 that may be used with devices such as, for example, liquid-crystal displays (LCDs) and electronic paper displays (EPDs). The light-reflecting device 272 includes similar structure as the light-emitting device 72 shown in FIG. 3, except that the housing 74 does not include light-emitting elements such as LEDs. Instead, unlike the light-emitting device 72 shown in FIG. 3, light rays 82 are generated by an exterior source of light (not illustrated), and enter the light-reflecting device 272 through the upper surface 84 of the housing 74 from a viewing side, which is not illustrated. The light rays 82 may then be reflected by the reflective adhesive layer 24 of the ACF 10 in a direction back towards the upper surface 84 of the housing 74.

Referring generally to the figures, the disclosed ACF includes a reflective layer as well as a non-reflective adhesive layer. The reflective layer is required to achieve high reflectivity, while the non-reflective adhesive layer is used to facilitate the transfer of conductive particles during the microfluidic transfer process. The reflective layer may be either a reflective adhesive layer (shown in FIG. 1), or a thin film deposited reflective layer (shown in FIG. 2). The reflective layer of the ACF results in improved light output and color purity characteristics when the ACF is part of a light-emitting, a light-transmitting or a transreflective device. Additionally, the ACF also results in improved attachment of the ACF 10 to the electrode substrate 76 (shown in FIG. 3) during pre-bonding. Those of ordinary skill in the art will readily appreciate that the improved bonding capability is an unexpected but desirable result, since reduced attachability of the ACF is typically experienced when the concentration of conductive particles is increased.

EXAMPLE 1

In Example 1, a fixed-array ACF with a reflective adhesive layer laminated onto a non-reflective adhesive layer was produced. Specifically, an epoxy adhesive layer (I) composition comprising 31.5 parts of a phenoxy resin (PKFE) from InChem Corp., 5.2 parts of acrylic block copolymer M52N from Arkema Chemicals Company, 3.0 parts of bisphenol A diepoxide from Sigma-Aldrich, 4.0 parts of glycerol triepoxide from Sigma-Aldrich, 0.5 parts of Silwet 7622 from Momentive Performance Materials, Inc., 3.3 parts of CAB—O-Sil L90 from Cabot Corp., and 49.4 parts of HXA 3922 from Asahi Chemicals was coated on a 2 mil T-10 release film (a polyethylene terephthalate (PET) release liner from Eastman Chemical Company) with a target thickness of 6.0±0.5 um. A reflective adhesive layer (II) comprising 80 parts of the adhesive (I) and 20 part of titanium dioxide ($TiO_2$) (Ti-Pure R706 from DuPont) was coated with a target thickness of 5.5±0.5 um on a 2 mil PET substrate pre-treated with 0.08 to 0.10 kw corona immediately before the coating. The two coated films were laminated by a laminator at a speed of 6 feet per minute (fpm) with a roller temperature of about 60° C. The T-10 release film was peeled off, and the resultant epoxy composite adhesive film was further subjected to heat at 50° C. at 6 fpm. The total thickness of the resultant adhesive film was 11.5±0.5 um.

An array of microcavities of about 5 um (diameter of the opening) and about 3-4 um (depth) and 2-3 um (partition) was prefilled with conductive Au/Ni plated polymer particles of 3.2 um diameter by a microfluidic particle filling process, and the particles were subsequently transferred onto the above-mentioned composite adhesive film at 65° C., 5.5 fpm as taught in the '214 patent to Liang as well as U.S. Patent Publications 2014/0312501, 2014/0261992, and 2013/0071636, all to by Liang, et al. and are herein incorporated by reference in their entirety. The particle filling and transfer process were repeated to achieve a maximum conductive particle density of at least 30,000 pcs/mm², followed by a calendering process at 70° C., 6 fpm to substantially push the conductive particles into the adhesive film.

EXAMPLE 2

In Example 2, the above-described procedure of Example 1 was repeated, except that the thickness of the reflective adhesive layer (II) was reduced to 2.5±0.5 um and the total thickness of the resultant composite epoxy adhesive film was about 8.5±0.5 um. The UV-Vis spectroscopy results of the laminated epoxy are shown in Table 1, and the conductive particle density, particle capture rate after bonding, and the sheer force of the bonded integrated circuit (IC) chip are shown in Table 2. As seen in Table 1 and Table 2, a reflectivity of at least 55% and a particle transfer efficiency of at least 97% (the ratio of the number of conductive particle transferred onto the adhesive film after the microfluidic filling/transfer processes to the number of microcavities on the array) can be achieved with satisfactory (>35%) particle capture rate (defined as the % of particles captured on the chip bump or electrode after bonding) and shear force (>25 MPa) after IC bonding. A reflectance of >70% may be achieved with the thickness of the reflective layer increased to 5.5 um (Example 1). It should be noted that in Table 2, capture rate is determined on data obtained from a bump size of 1500 um².

TABLE 1

UV-Vis Spectroscopy Results of the Reflective ACF

| | Wavelength | % Absorption | % Transmission | % Reflectance |
|---|---|---|---|---|
| Example 1 | 450 nm | 30.2 | 3.8 | 66.0 |
| (Reflective layer | 550 nm | 24.0 | 4.4 | 71.6 |
| 5.5 um) | 650 nm | 20.9 | 5.2 | 73.8 |
| Example 2 | 450 nm | 40.2 | 3.8 | 56.0 |
| (Reflective layer | 550 nm | 34.7 | 4.4 | 60.9 |
| 2.5 um) | 650 nm | 33.3 | 5.2 | 61.5 |

TABLE 2

Particle Density, Capture Rate and Shear Force Performance Results

| | Example 1 | Example 2 |
|---|---|---|
| Conductive particle transferred (pcs/mm²) | 37,139 (> 97% transfer efficiency) | 37,739 (>97% transfer efficiency) |
| Particle Capture Rate* | 36% | 37% |
| Shear Force (160 C. 5 s 60 MPa) | 30.0 MPa | 36.3 MPa |

*Capture rate is determined on data obtained from a bump size of 1500 um²

Example 3

In Example 3, a comparative fixed-array ACF without the reflective layer was produced. Specifically, a fixed-array ACF without a reflective layer was prepared using the procedure of Example 1, except that only the adhesive layer (I) of 11.5±0.5 um thickness was used.

Example 4

In Example 4, a comparative fixed-array ACF was produced. Specifically, a fixed-array ACF with a single adhesive layer (III) of 11.5±0.5 um thickness was prepared with the procedure of Example 3, except that the adhesive layer (III) contained a homogeneous mixture of the adhesive layer (I) and the reflective adhesive layer (II) of the Example 1.

The UV-Vis Spectroscopy of the ACFs, bonding attachment and the performance of the bonded chips of Examples 3 and 4 are shown in Tables 4-6. As seen in Table 4, the ACF of comparative Example 3 containing only the non-reflective adhesive (I) layer showed a negligible reflectivity. Also, the ACF of Example 4 also showed a very low % reflectance when compared to Example 1 having a composite adhesive layer (I)+(II), even though the both of the ACFs contain exactly the same amount of the reflective pigment.

ACFs (both of thickness 11.5 um) were pre-bonded, and the attachment results are shown in Table 5. The ACF comprising composite adhesive layers (Example 1) exhibits an easier attachment to the ITO glass at lower bonding pressures and shorter bonding time than ACFs of of Examples 3 and 4. It may also be observed in Table 6 that the ACF of Examples 1 and 3 showed a significantly higher capture rate and shear force than Examples 1. It was also found that the fixed-array ACF having composite reflective adhesive layers (Example 1) showed a higher particle transfer efficiency in the microfluidic particle filling/transfer processes that that of the ACF having a single mixture adhesive layer, even though the ingredients in the two examples are essentially the same.

TABLE 4

UV-Vis Spectroscopy Results of the Reflective ACF vs. Non-Reflective ACF

| | Wavelength | % Absorbance | % Transmission | % Reflectance |
|---|---|---|---|---|
| Example 1 | 450 nm | 30.2 | 3.8 | 66.0 |
| | 550 nm | 24.0 | 4.4 | 71.6 |
| | 650 nm | 20.9 | 5.2 | 73.8 |
| Example 3 | 450 nm | 82.9 | 17.1 | negligible |
| | 550 nm | 79.4 | 20.6 | negligible |
| | 650 nm | 78.7 | 21.3 | negligible |
| Example 4 | 450 nm | 99.5 | 0.5 | 0.5 |
| | 550 nm | 99.3 | 0.7 | 0.6 |
| | 650 nm | 99.1 | 0.9 | 0.7 |

TABLE 5

Attachment Results of the ACF to the ITO Glass at Varying Bonding Conditions

| Bonding Conditions* | | | Attachment | | |
|---|---|---|---|---|---|
| Temperature (C.) | Pressure (MPa) | Time(s) | Example 1 | Example 3 | Example 4 |
| 80 | 0.3 | 1 | Pass | Pass | Pass |
| | 0.2 | 1 | Pass | Pass | Fail |
| 70 | 0.3 | 1 | Pass | Fail | Fail |

*ACF from 5 C. storage, 1 hour minute warm-up at 25 C.

TABLE 6

Particle Density, Capture Rate, and Shear Force Performance Results of Non-Reflective ACF

| | Example 1 | Example 3 | Example 4 |
|---|---|---|---|
| Thickness | 11.5 um | 11.5 um | 11.5 um |
| Conductive particle transferred (pcs/mm$^2$) | 37,139 (>97% transfer efficiency) | 37,611 (>97% transfer efficiency) | 30,273 (about 80% transfer efficiency) |
| Particle Capture Rate* | 36% | 18% | 24% |
| Shear Force (160 C. 5 s 60 MPa) | 30.0 MPa | 25.5 MPa | 18.0 MPa |

*Capture rate is determined on data obtained from a bump size of 1500 um$^2$

Having described the disclosure in detail and by reference to specific embodiments thereof it will be apparent that numerous variations and modifications are possible without departing from the spirit and scope of the following claims.

What is claimed is:

1. An anisotropic conductive film (ACF), comprising:
a non-reflective adhesive layer including a top surface;
a plurality of conductive particles included with the non-reflective adhesive layer; and
a reflective adhesive layer disposed along the top surface of the non-reflective adhesive layer, wherein the reflective layer includes at least five percent reflective particles by percentage weight,
wherein:
the ACF is a fixed-array ACF and the conductive particles are arranged in predetermined locations along a bottom surface of the non-reflective adhesive layer; and
the non-reflective adhesive layer includes a concentration of at least 20,000 pcs/mm$^2$ of the conductive particles.

2. The ACF of claim 1, wherein the conductive particles are partially embedded along the bottom surface of the non-reflective adhesive layer.

3. The ACF of claim 1, wherein the reflective particles are selected from the group consisting of: reflective and retro-reflective particles.

4. The ACF of claim 1, wherein the reflective particles are selected from the group consisting of: electrical conductors and electrical insulators.

5. The ACF of claim 1, wherein the reflective particles are high refractive index oxides selected from the group consisting of: indium-tin-oxide (ITO), zinc oxide (ZnO), titanium dioxide (TiO$_2$), indium-zinc-oxide (IZO), tin oxide (SnO), zirconium oxide (ZrO$_2$), and their alloys thereof.

6. The ACF of claim 1, wherein the reflective particles are selected from the group consisting of: hollow glass microspheres, mica, cholesteric liquid crystal pigment particles, and holo cross-linked polymer particles.

7. The ACF of claim 1, wherein the reflective layer comprises filler particles selected from the group consisting of: zinc oxide (ZnO), boron nitride (SN), silicon oxide (SiO$_2$), aluminium oxide (Al$_2$O$_3$), calcium carbonate (CaCO$_3$), or calcium sulfate (CaSO$_4$), and combinations thereof.

8. The ACF of claim 1, wherein the reflective layer includes at least ten percent reflective particles by percentage weight.

9. The ACF of claim 8, wherein the top surface of the non-reflective adhesive layer is pre-embossed.

10. The ACF of claim 1, comprising a release liner disposed along a top surface of the reflective layer.

11. The ACF of claim 10, wherein a bottom surface of the release liner is pre-embossed.

12. The ACF of claim 1, wherein the reflective adhesive layer includes a thickness ranging from about 1 μm to about10 μm.

13. An anisotropic conductive film (ACF), comprising:
a non-reflective adhesive layer including a top surface;
a plurality of conductive particles included with the non-reflective adhesive layer; and
a thin film deposited reflective layer disposed along the top surface of the non-reflective adhesive layer, the thin film deposited reflective layer including a second top surface; and
a secondary adhesive layer disposed along the second top surface of the thin film deposited reflective layer,
wherein:
the ACF is a fixed-array ACF and the conductive particles are arranged in predetermined locations along a bottom surface of the non-reflective adhesive layer; and
the non-reflective adhesive layer includes a concentration of at least 20,000 pcs/mm$^2$ of the conductive particles.

14. The ACF of claim 13, wherein the conductive particles are partially embedded along the bottom surface of the non-reflective adhesive layer.

15. The ACF of claim 13, wherein the reflective layer includes at least ten percent reflective particles by percentage weight.

16. The ACF of claim 13, wherein the thin film deposited reflective layer is a vapor deposited layer.

17. The ACF of claim 13, wherein the thin film deposited reflective layer is a reflective sputtered layer.

18. A light-emitting device, comprising:
a light-emitting housing including a plurality of light-emitting elements;
an electrode substrate;
a plurality of chip bumps disposed between the light-emitting housing and the electrode substrate; and
an anisotropic conductive film (ACF) electrically connecting the light-emitting housing and the electrode substrate, comprising:
a non-reflective adhesive layer including a top surface;
a plurality of conductive particles included with the non-reflective adhesive layer; and
a reflective adhesive layer disposed along the top surface of the non-reflective adhesive layer, wherein the reflective layer includes at least five percent reflective particles by percentage weight,
wherein the ACF is a fixed-array ACF and the conductive particles are arranged in predetermined locations along a bottom surface of the non-reflective adhesive layer.

19. The light-emitting device of claim 18, wherein the reflective layer includes at least ten percent reflective particles by percentage weight.

20. The light-emitting device of claim 18, wherein the reflective particles are high refractive index oxides selected from the group consisting of: indium-tin-oxide (ITO), zinc oxide (ZnO), titanium dioxide (TiO$_2$), indium-zinc-oxide (IZO), tin oxide (SnO), zirconium oxide (ZrO$_2$), and their alloys thereof.

21. The light-emitting device of claim 18, wherein the reflective particles are selected from the group consisting of:

hollow glass microspheres, mica, cholesteric liquid crystal pigment particles, and holo cross-linked polymer particles.

22. The light-emitting device of claim 18, wherein the reflective layer comprises filler particles selected from the group consisting of: zinc oxide (ZnO), boron nitride (SN), silicon oxide ($SiO_2$), aluminium oxide ($Al_2O_3$), calcium carbonate ($CaCO_3$), or calcium sulfate ($CaSO_4$), and combinations thereof.

23. A light-reflecting or transflecting device, comprising:
a housing;
an electrode substrate;
an anisotropic conductive film (ACF) electrically connecting the housing and the electrode substrate, comprising:
   a non-reflective adhesive layer including a top surface;
   a plurality of conductive particles included with the non-reflective adhesive layer; and
   a reflective adhesive layer disposed along the top surface of the non-reflective adhesive layer, wherein the reflective layer includes at least five percent reflective particles by percentage weight; wherein:
pre-bonding the ACF was a fixed-array ACF and the conductive particles were arranged in predetermined locations along a bottom surface of the non-reflective adhesive layer; and
   the non-reflective adhesive layer includes a concentration of at least 20,000 pcs/$mm^2$ of the conductive particles; and
a plurality of chip bumps in contact with at least a portion of the conductive particles.

24. The light-reflecting or transflecting device of claim 23, wherein the reflective layer includes at least ten percent reflective particles by percentage weight.

25. The light-reflecting or transflecting device of claim 23, wherein the reflective particles are high refractive index oxides selected from the group consisting of: indium-tin-oxide (ITO), zinc oxide (ZnO), titanium dioxide ($TiO_2$), indium-zinc-oxide (IZO), tin oxide (SnO), zirconium oxide ($ZrO_2$), and their alloys thereof.

26. The light-reflecting or transflecting device of claim 23, wherein the reflective particles are selected from the group consisting of: hollow glass microspheres, mica, cholesteric liquid crystal pigment particles, and holo cross-linked polymer particles.

27. The light-reflecting or transflecting device of claim 23, wherein the reflective layer comprises filler particles selected from the group consisting of: zinc oxide (ZnO), boron nitride (SN), silicon oxide ($SiO_2$), aluminium oxide ($Al_2O_3$), calcium carbonate ($CaCO_3$), or calcium sulfate ($CaSO_4$), and combinations thereof.

* * * * *

UNITED STATES PATENT AND TRADEMARK OFFICE
CERTIFICATE OF CORRECTION

| | | |
|---|---|---|
| PATENT NO. | : 9,871,177 B2 | Page 1 of 1 |
| APPLICATION NO. | : 14/638306 | |
| DATED | : January 16, 2018 | |
| INVENTOR(S) | : Rong-Chang Liang, Jane Sun and Keren Zhang | |

It is certified that error appears in the above-identified patent and that said Letters Patent is hereby corrected as shown below:

On the Title Page

In Item (54), the title of the invention, please delete "RELFECTIVE" and insert --REFLECTIVE--

In the Specification

In Column 1, Line 2, please delete "RELFECTIVE" and insert --REFLECTIVE--

Signed and Sealed this
Third Day of May, 2022

Katherine Kelly Vidal
*Director of the United States Patent and Trademark Office*